United States Patent [19]

Takizawa et al.

[11] Patent Number: 5,926,012

[45] Date of Patent: Jul. 20, 1999

[54] GATE DRIVE CIRCUIT IN POWER CONVERTER WITH CONDITION DETECTION DEVICE

[75] Inventors: Satoki Takizawa, Tokyo; Manabu Takei, Nagano, both of Japan

[73] Assignee: Fuji Electric Co., Ltd., Kawasaki, Japan

[21] Appl. No.: 08/931,280

[22] Filed: Sep. 16, 1997

Related U.S. Application Data

[30] Foreign Application Priority Data

Sep. 20, 1996 [JP] Japan ................................. 8-249841
Feb. 17, 1997 [JP] Japan ................................. 9-032224

[51] Int. Cl.[6] ......................................................... G05F 1/40
[52] U.S. Cl. ......................................................... 323/284
[58] Field of Search .................................. 327/108, 109, 327/110; 323/284, 289, 266

[56] References Cited

U.S. PATENT DOCUMENTS

| | | | |
|---|---|---|---|
| 4,933,614 | 6/1990 | Kawata | 318/432 |
| 5,338,977 | 8/1994 | Carobolante | 327/110 |
| 5,438,499 | 8/1995 | Bonte et al. | 363/21 |

*Primary Examiner*—Shawn Riley
*Attorney, Agent, or Firm*—Kanesaka & Takeuchi

[57] ABSTRACT

A gate drive circuit in a power converter includes a voltage-driven switching device, and a gate drive circuit connected to the voltage-driven switching device for driving the same. The gate drive circuit includes a detection device for detecting a physical quantity in the switching device, and an operation device for changing a gate drive condition of the switching device. When an output of the detection means becomes a value outside a specified value at a turn-on or turn-off operation of the switching device, the operation device changes the gate drive condition instantaneously or for a predetermined time to reduce a voltage applied to the switching device.

18 Claims, 10 Drawing Sheets

GATE DRIVE CIRCUIT IN POWER CONVERTER WITH CONDITION DETECTION DEVICE

BACKGROUND OF THE INVENTION AND RELATED ART STATEMENT

The present invention relates to an improvement of a gate drive circuit for a voltage-driven switching device, such as an FET or IGBT (insulating-gate bipolar transistor).

FIG. 16 shows an example of an IGBT used as a voltage-driven switching device, and FIG. 17 shows an example of an inverter main circuit used as a power converter.

In FIG. 16, reference numeral 1 designates an IGBT as a main device; 36 is a gate drive circuit power supply at a positive side for applying a voltage between the gate and emitter of the IGBT while it is being turned on; 37 is a gate drive circuit power supply at a negative side for applying a voltage between the gate and emitter of the IGBT while it is being turned off; and 38 is a control circuit for an inverter, which generates instructions to switch the IGBT on and off. Reference numeral 39 denotes an insulator, such as photocoupler (PC), for transmitting instructions from a low-electricity section to a high-electricity section to turn the IGBT on and off; 40 is a gate resistor for turning the IGBT on; 41 is a gate resistor for turning the IGBT off; 42 and 43 are switch transistors for connecting each gate resistor to the gate of the IGBT; and 44 is an amplifier for driving the transistors 42, 43. Signals transmitted via the insulator 39 cause a positive voltage or a negative voltage from the power supplies 36, 37 to be applied between the gate and emitter of the IGBT, to turn it on and off.

In FIG. 17, reference numeral 45 indicates a diode rectifier for converting AC to DC; 46 is a DC intermediate capacitor; 47 is an inverter comprising an IGBT and a diode (also simply referred to as "FWD") for converting DC to AC; and 49 is a snubber circuit for protecting the inverter from a spike voltage generated by an inductance 48 between the DC intermediate capacitor 46 and the inverter 47.

Factors which affect switching characteristics of the IGBT or gate drive circuit are: a gate resistance Rg; a gate drive circuit power supply voltage Vg; a gate current (current flowing in and out of the gate of the IGBT) Ig; a capacitance between the gate and emitter of the IGBT as seen from the gate drive circuit $C_{GE}$; and a capacitance between the gate and collector of the IGBT as seen from the gate drive circuit $C_{GC}$.

Table 1 shows the direction of the change in each of the switching characteristics of the IGBT when the number of conditions (absolute value) of the IGBT or the gate drive circuit increase. When the number of conditions decrease, each switching characteristic of the IGBT changes in the direction opposite to that shown in Table 1.

TABLE 1

|  | Rg large | Vg large | Ig large | $C_{GE}$ large | $C_{GC}$ large |
| --- | --- | --- | --- | --- | --- |
| di/dt at turn on | Low | High | High | Low | Low |
| di/dt at turn off | Low | High | High | Low | Low |
| dv/dt at turn on | Low | High | High | Low | Low |
| dv/dt at turn off | Low | High | High | Low | Low |
| $v_{peak}$ at turn off | Low | High | High | Low | Low |
| $i_{peak}$ at turn on | Low | High | High | Low | Low |

On the other hand, if the inverter comprises a voltage-driven switching device, such as an IGBT, the wiring inductance present between the DC intermediate capacitor and the inverter causes a high voltage to the switching device, such as an IGBT or FWD, when the IGBT is switched on and off, as shown in Equation (1).

Equation 1

$V_{CE} = Ed + L \cdot di/dt$ $V_{CE}$: Voltage applied to device
Ed: DC intermediate capacitor voltage
L: Wiring inductance
di/dt: Current change rate during switching Thus, when the inverter device is formed by using an IGBT and FWD, the device must have a voltage rating that satisfies Equation (1) or a snubber circuit must be added. Furthermore, it has been pointed out that a significant noise may be generated from the apparatus if dv/dt and/or di/dt is large during switching.

FIG. 18 shows approximate waveforms of the current and voltage when the device is being turned off, and FIG. 19 shows approximate waveforms of the current and voltage when the device is being turned on. As is apparent from these figures, when the device is being turned off, the magnitude of di/dt of the turn-off current of the IGBT affects the magnitude of the spike voltage directly applied to the IGBT by Equation (1). On the other hand, when the device is being turned on, the magnitude of di/dt of the turn-on current of the IGBT affects the magnitude of the spike current flowing through the IGBT (reverse recovery current flowing through the FWD on the opposite arm), which in turn affects the magnitude of di/dt during the reverse recovery of the FWD on the opposite arm. That is, when the di/dt at the time of turn-on of the IGBT increases, the di/dt at the reverse recovery of the FWD on the opposite arm also increases, which causes a large dv/dt to be applied to the FWD and also increases a spike voltage applied to it according to Equation (1).

Thus, the invention is aimed at eliminating a snubber circuit and reducing noise in a gate drive circuit for a voltage-driven switching device.

SUMMARY OF THE INVENTION

To achieve this object, the invention in a first aspect provides a gate drive circuit for a voltage-driven switching device with an IGBT, which comprises detection means for detecting a physical quantity for the switching device and operation means for changing gate drive conditions, wherein when the output of the detection means becomes a specified value or larger or becomes smaller than the specified value at the time of turn-on of the switching device, the operation means instantaneously changes the gate drive condition.

The invention in a second aspect provides a gate drive circuit for a voltage-driven switching device with an IGBT, which comprises detection means for detecting a physical quantity for the switching device and operation means for changing gate drive conditions, wherein when the output of the detection means becomes a specified value or larger or becomes smaller than the specified value at the time of turn-on of the switching device, the operation means maintains the changed gate drive condition for a specified time.

In the invention in the first or second aspect, the detection means may detect at least one of a collector current time differential equivalent, collector current equivalent, and collector-to-emitter voltage time differential equivalent of the switching device, and the operation means may change at least one of a gate resistance, gate power supply voltage, gate current, gate-emitter capacitance, and gate-collector capacitance of the switching device (third aspect).

The invention in a fourth aspect provides a gate drive circuit for a voltage-driven switching device with an IGBT, which comprises detection means for detecting a physical quantity for the switching device and operation means for changing gate drive conditions, wherein when the output of the detection means becomes a specified value or larger or becomes smaller than the specified value at the time of turn-off of the switching device, the operation means instantaneously changes the gate drive condition.

The invention in a fifth aspect provides a gate drive circuit for a voltage-driven switching device with an IGBT, which comprises detection means for detecting a physical quantity for the switching device and operation means for changing gate drive conditions, wherein when the output of the detection means becomes a specified value or larger or becomes smaller than the specified value at the time of turn-off of the switching device, the operation means maintains the changed gate drive condition for a specified time.

In the invention in the fourth or fifth aspect, the detection means may detect at least one of a collector current time differential equivalent, collector-emitter voltage time differential equivalent, or collector-emitter voltage equivalent of the switching device, and the operation means may change at least one of a gate resistance, gate power supply voltage, gate current, gate-emitter capacitance, or gate-collector capacitance of the switching device (sixth aspect).

An invention in a seventh aspect provides a gate drive circuit for a voltage-driven switching device with an IGBT, which comprises detection means for detecting a collector current time differential equivalent of the switching device when it is turned off; and adjustment means for adjusting a voltage applied between the gate and emitter of the switching device depending on the value detected by the detection means. In the invention described in the seventh aspect, the adjustment means comprises a field-effect transistor connected between the positive electrode of the positive power supply of the gate drive circuit and the gate terminal of the switching device (eighth aspect).

BRIEF DESCRIPTION OF THE DRAWINGS

FIG. 19 describes an operation of an IGBT element while the device is being turned on.

DETAILED DESCRIPTION OF PREFERRED EMBODIMENTS

The invention comprises a detection circuit for detecting a physical quantity at the time of switching of a switching device, and operation means for changing gate drive conditions, wherein when the output from the detection circuit becomes a specified value or larger or becomes smaller than the specified value, the gate drive condition is controlled in two ways based on the output from the operation means. Table 2 shows the relationship among the physical quantity to be detected, the gate drive conditions to be manipulated, and the controlling method in this invention.

TABLE 2

| Physical amount to be detected | Gate condition to be manipulated | Control Method |
|---|---|---|
| di/dt at turn on | Gate resistance (Rg) | Instantaneous value control |
| ic at turn on | Gate power supply voltage (Vg) | |
| dv/dt at turn on | Gate current (Ig) | |
| di/dt at turn off | Gate-emitter capacitance ($C_{GE}$) | One-shot control |
| dv/dt at turn off | Gate-collector capacitance ($C_{GC}$) | |
| $v_{CE}$ at turn off | | |

A specific example of the detection circuit is described below.

Figure 1:
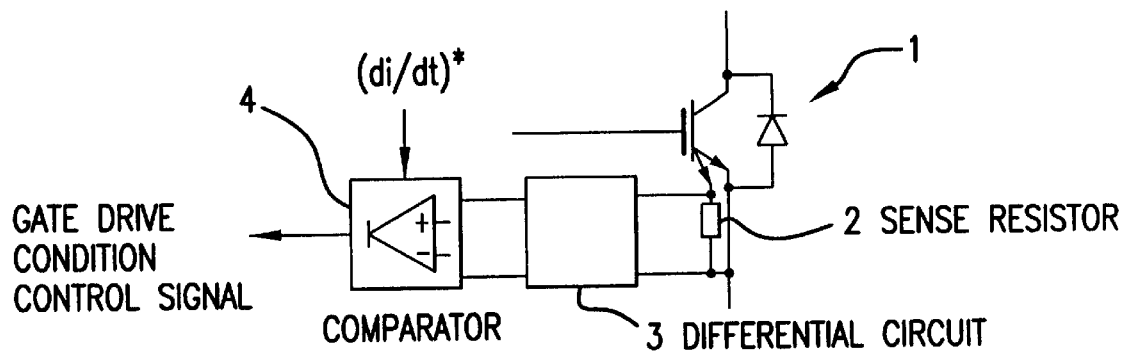
FIG. 1 is a circuit diagram showing a first embodiment of a detection circuit used in the invention.

(1) FIG. 1 is a circuit diagram showing a first embodiment of a detection circuit used in this invention, and illustrates the detection circuit for detecting the di/dt of a collector current $i_c$ when the device is being turned on.

Reference numeral 1 designates a main IGBT and a FWD, and 2 is a sense resistor integrated into the IGBT module for detecting a current of the IGBT. When the voltage at both ends of the sense resistor 2, i.e. equivalent of the current value of the IGBT, is inputted to a differential circuit 3, the output becomes the equivalent of di/dt. A comparator 4 then compares this value with the instructed value (di/dt)* of di/dt, and the result of the comparison is used as a control signal for changing the gate drive condition. The comparator may be one that uses, for example, the threshold of an FET.

Figure 2:
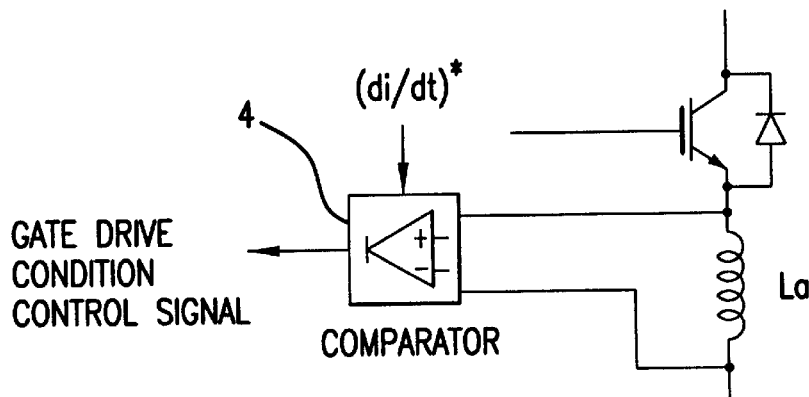
FIG. 2 is a circuit diagram showing a variation of FIG. 1.

FIG. 2 represents a variation of FIG. 1. In this example, the differential equivalent of the collector current $i_c$ is detected from the voltage at both ends of the inductance La (intentionally inserted inductance or wiring inductance.)

(2) Since the di/dt of collector current $i_c$ when the device is being turned off differs only in polarity from that when the device is being turned on, the circuit in FIG. 1 or 2 may also be used to detect the di/dt of collector current i, when the device is being turned off. In this case, the polarity of the instructed value (di/dt)* of di/dt is inverted, so that the comparator 4 compares this value to the output of the differential circuit 3.

Figure 3:
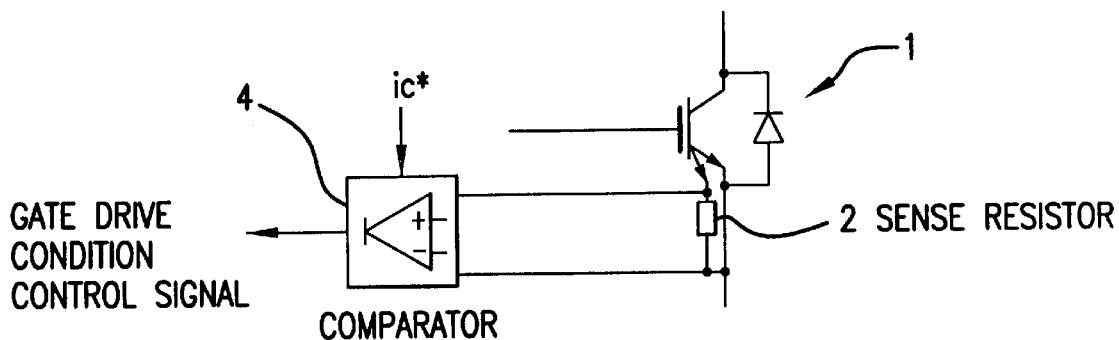
FIG. 3 is a circuit diagram showing another embodiment of the detection circuit.

(3) FIG. 3 is a circuit diagram showing another embodiment of a detection circuit, and illustrates the detection circuit for detecting the collector current $i_c$ when the device is being turned on.

Reference numeral 1 designates a main IGBT and FWD, and 2 is a sense resistor integrated into the IGBT module for detecting the current of the IGBT. The comparator 4 compares the voltage at both ends of the sense resistor 2, i.e. equivalent of the current value of the IGBT, to an instructed current value $(i_c)^*$, and the result of the comparison is used as a control signal to change the gate drive condition.

Figure 4:
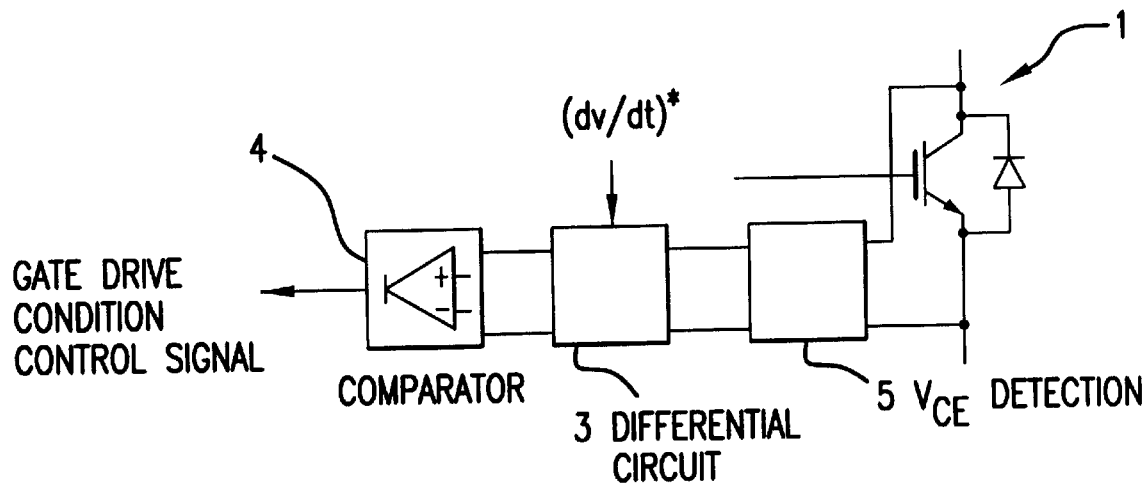
FIG. 4 is a circuit diagram showing still another embodiment of the detection circuit.

(4) FIG. 4 is a circuit diagram showing still another embodiment of a detection circuit, and illustrates the detection circuit for detecting the dv/dt of a collector-emitter voltage $V_{CE}$ when the device is being turned on.

Reference numeral 1 designates a main IGBT and FWD, and 5 is a detection section (comprising a resistance-type potential divider) for detecting the collector-emitter voltage $V_{CE}$ of the main IGBT. When the output $V_{CE}$ from the detection circuit 5 is inputted to a differential circuit 3, an equivalent of dv/dt can be obtained from the output of the circuit 3. A comparator 4 then compares this value to an instructed value (dv/dt)*, and the result of the comparison is used as a control signal to change the gate drive condition.

(5) Since the dv/dt of the collector-emitter voltage $V_{CE}$ when the device is being turned off differs only in polarity from that when the device is being turned on, the circuit in FIG. 4 may also be used to detect dv/dt while it is turned off. In this case, the polarity of the instructed value (dv/dt)* of dv/dt is inverted, so the comparator 4 compares this value to the output of the differential circuit 3.

Figure 5:
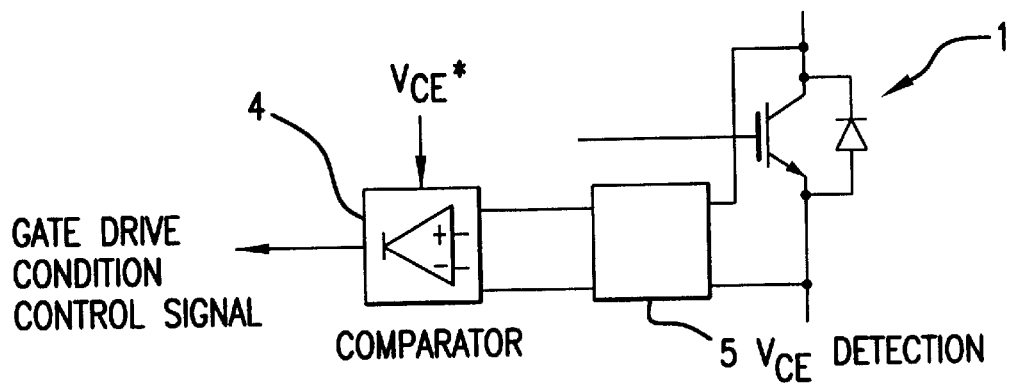
FIG. 5 is a circuit diagram showing yet another embodiment of the detection circuit.

(6) FIG. 5 is a circuit diagram showing yet another embodiment of the detection circuit, and illustrates the detection circuit for detecting the collector-emitter voltage $V_{CE}$ while the device is being turned on.

Reference numeral 1 designates a main IGBT and FWD, and 5 is a detection section (comprising a resistance type potential divider) for detecting the collector-emitter voltage $V_{CE}$ of the main IGBT. The comparator 4 compares the output $V_{CE}$ from the detection circuit to an instructed value $V_{CE}^*$, and the result of the comparison is used as a control signal to change the gate drive condition.

Next, the operation circuit used to change the gate drive condition is described.

Figure 6:
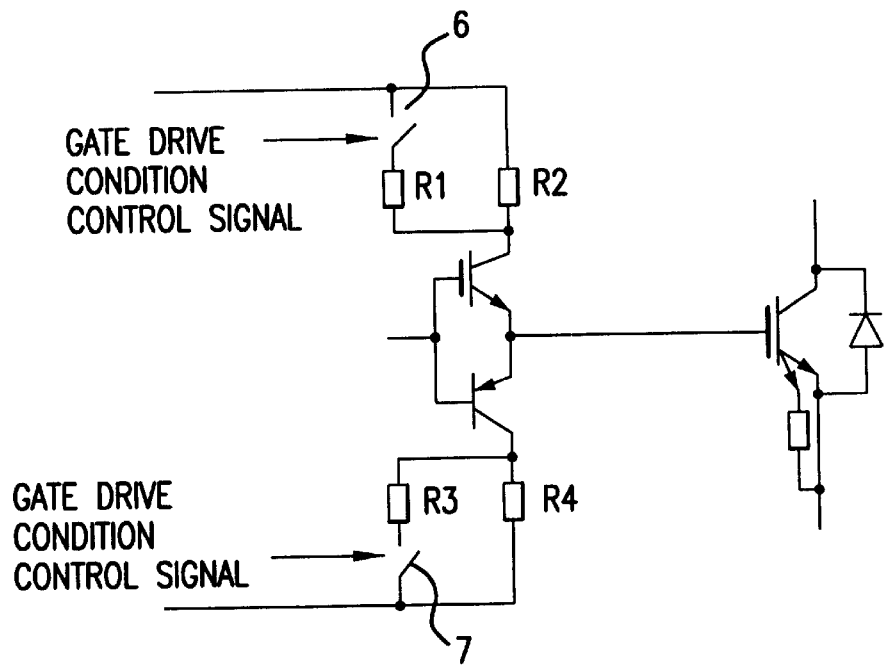
FIG. 6 is a circuit diagram showing a first embodiment of the gate drive condition operation circuit.

(i) FIG. 6 is a circuit diagram showing an embodiment of an operation circuit, and illustrates an example in which the gate resistance value varies.

The gate resistance Rg can be varied by turning switch circuits 6, 7, i.e. the switch circuit 6 is used when the IGBT is turned on whereas the switch circuit 7 is used when the IGBT is turned off, on and off by using the gate drive condition control signal that is shown as the output in FIGS. 1 to 5. In FIG. 6, in a normal state, the switch circuits 6, 7 are turned on, and the gate resistance Rg comprises the parallel resistance value of R1 and R2 (R3 and R4).

When the IGBT is switched, the detected physical quantity becomes a set value or larger. When the comparator in FIGS. 1 to 5 is operated, the switch circuit 6 or 7 is turned off and the gate resistance becomes R2 (R4), that is, it increases. In this case, the switching characteristic of the IGBT, for example di/dt, is lower than that when the switch circuit 6 or 7 is on-state.

Figure 7:
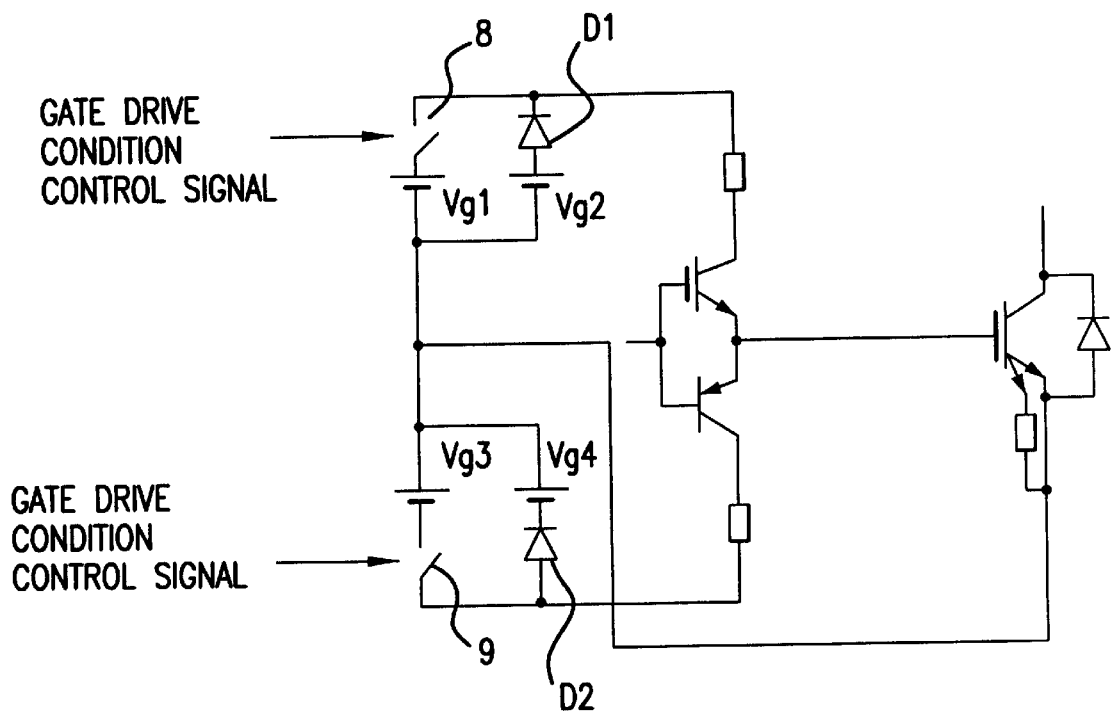
FIG. 7 is a circuit diagram showing another embodiment of the gate drive condition operation circuit.

(ii) FIG. 7 is a circuit diagram showing another embodiment of an operation circuit, and illustrates an example in which the value of the power supply voltage of the gate circuit varies.

The value of the gate power supply voltage can be varied by turning switch circuits 8, 9, i.e. the switch circuit 8 is operated when the IGBT is turned on whereas the switch circuit 9 is operated when the IGBT is turned off, on and off by using the gate drive condition control signal that is shown as the output in FIGS. 1 to 5. In FIG. 7, in the normal state, the switch circuits 8, 9 are turned on, and the gate power supply voltage is Vg1 (Vg3). In this case, since Vg1>Vg2 (Vg3>Vg4), diodes D1 and D2 are connected together. When the IGBT is switched, the detected physical quantity becomes a specified value or larger. Then, when the comparator in FIGS. 1 to 5 is operated, the switch circuit 8 or 9 is turned off to cause the gate power supply voltage to become Vg2 (Vg4), i.e. to decrease. In this case, the switching characteristic of the IGBT, for example di/dt, operates to become lower than that when the switch circuit 8 or 9 is on-state.

Figure 8A:
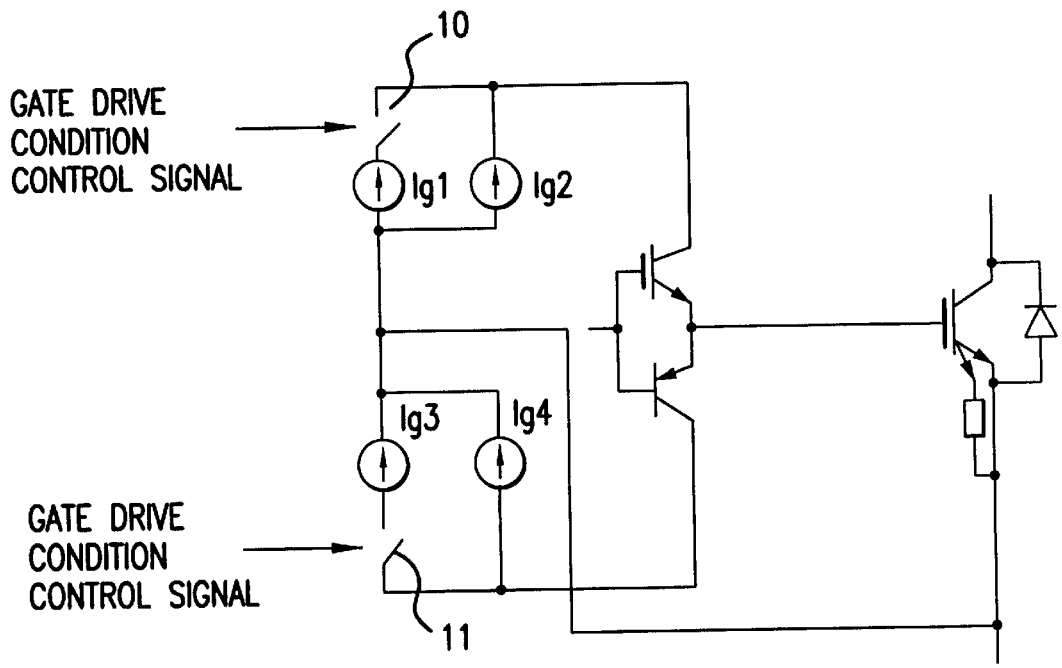
FIGS. 8(a) and 8(b) are circuit diagrams showing still other embodiments of the gate drive condition operation circuit.
Figure 8B:
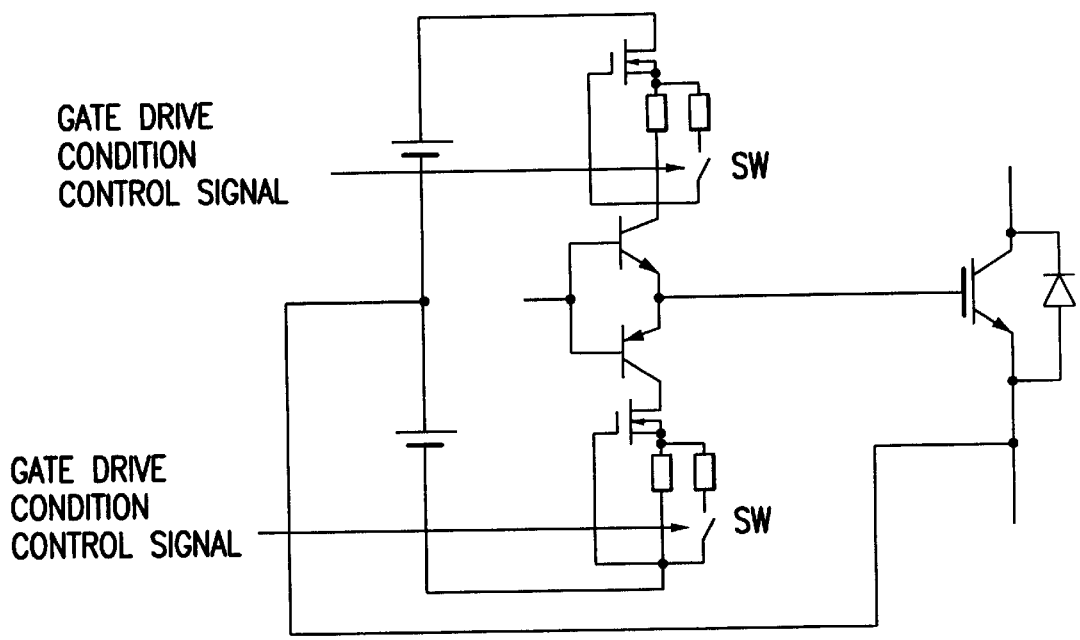

(iii) FIGS. 8(a) and 8(b) are circuit diagrams showing other embodiments of an operation circuit, and illustrate the examples in which the value of the gate current is varied.

The value of the gate current is varied by turning switch circuits 10, 11 on and off, i.e. the switch circuit 10 is operated when the IGBT is turned on whereas the switch circuit 11 is operated when the IGBT is turned off, by using the gate condition control signal that is shown as the output in FIGS. 1 to 5. In FIG. 8(a), in the normal state, the switch circuit 10 (11) is on-state, and the value of the gate current is Ig1+Ig2 (Ig3+Ig4). When the IGBT is switched, the detected physical quantity becomes a specified value or larger. Then, when the comparator in FIGS. 1 to 5 is operated, the switch circuit 10 or 11 is turned off to cause the gate current to become Ig2 (Ig4). In this case, the switching characteristic of the IGBT, i.e. di/dt, is lower than that when the switch circuit 10 or 11 is on-state.

In fact, however, the switch circuits 10 and 11 in series with the current source circuit can not be turned off, so that constant current source circuits in which switches SW are provided as shown in FIG. 8(b) are used for reducing the gate current value. In FIG. 8(b), the current value can be reduced by turning the switch SW off.

Figure 9A:
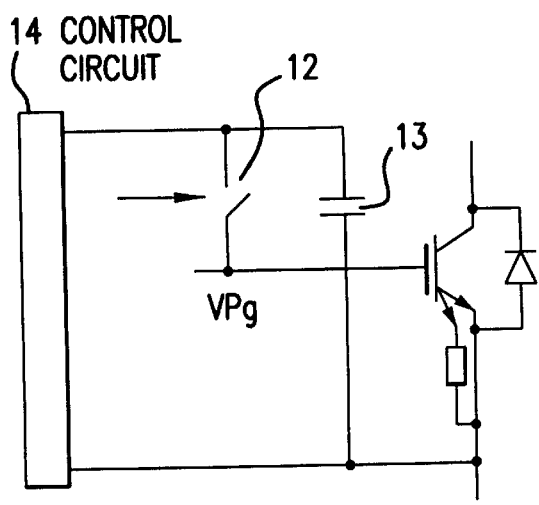
FIGS. 9(a) and 9(b) are circuit diagrams showing yet other embodiments of the gate drive condition operation circuit.
Figure 9B:
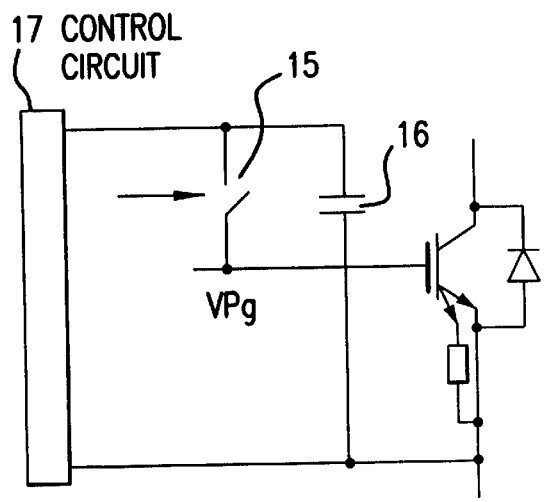

(iv) FIGS. 9(a) and 9(b) are circuit diagrams showing still other embodiments of an operation circuit, and illustrate examples in which a gate-emitter capacitance varies.

In FIG. 9(a), by turning a switch circuit 12 on by using the gate drive condition control signal that is shown as the output in FIGS. 1 to 5, a capacitor 13 is connected between the gate and emitter of the IGBT to force the potential of the gate to be changed. Likewise, in FIG. 9(b), by turning a switch circuit 15 on by using the gate drive condition control signal that is shown as the output in FIGS. 1 to 5, a capacitor 16 is connected between the gate and emitter of the IGBT to force the potential of the gate to be changed.

In these cases, in the normal state, the switch circuit 12 (15) is off-state, but a control circuit 14 maintains the voltage of the capacitor at 0 V or near 0 V when the IGBT is off-state, while a control circuit 17 charges the capacitor up to a specified value (near the threshold voltage of the gate or higher) when the IGBT is on-state.

When the device is being turned on:

the detected physical quantity becomes a set value or larger, so that when the comparator in FIGS. 1 to 5 is operated, the switch circuit 12 is turned on to instantaneously cause the capacitor 13 to reduce the potential of VPg in FIG. 9(a).

When the device is being turned off:

the detected physical quantity becomes a set value or larger, so that when the comparator in FIGS. 1 to 5 is operated, the switch circuit 15 is turned on to instantaneously cause the capacitor 16 to increase the potential of VPg in FIG. 9(b).

In this case, the switching characteristic of the IGBT, for example, di/dt, is lower than that when the switch circuit 12 (15) is off-state.

Figure 10A:
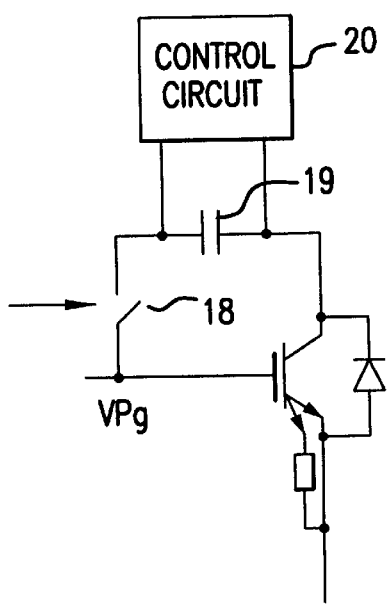
FIGS. 10(a) and 10(b) are circuit diagrams showing yet other embodiments of the gate drive condition operation circuit.
Figure 10B:
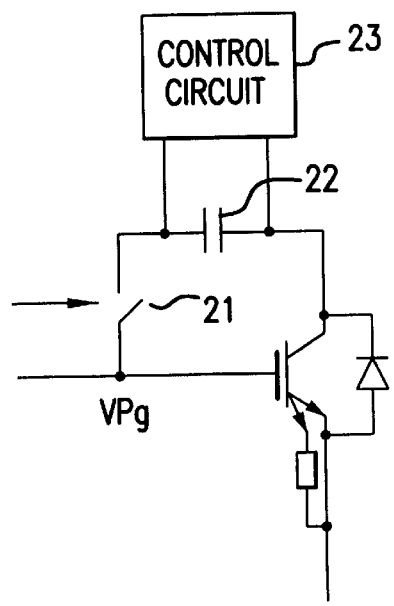

(v) FIGS. 10(a) and 10(b) are circuit diagrams showing yet other embodiments of the operation circuit, and illustrates the examples in which the gate-collector capacitance varies.

In FIG. 10(a), by turning a switch circuit 18 on by using the gate drive condition control signal shown as the output in FIGS. 1 to 5, a capacitor 19 is connected between the gate and collector of the IGBT to force the potential of the gate to be changed. Likewise, in FIG. 10(b), by turning a switch circuit 21 on by using the gate drive condition control signal shown as the output in FIGS. 1 to 5, a capacitor 22 is connected between the gate and collector of the IGBT to force the potential of the gate to be changed.

In these cases, in the normal state, the switch circuit 18 (21) is turned off, but a control circuit 20 maintains the voltage of the capacitor at 0 V or near 0 V when the IGBT is off-state, while a control circuit 23 charges the capacitor up to a specified value (near the threshold voltage of the gate or higher) when the IGBT is on-state.

When the device is being turned on:

the detected physical quantity becomes the set value or larger, and when the comparator in FIGS. 1 to 5 is operated, the switch circuit 18 is turned on, so that the potential of VPg in FIG. 10(a) is reduced instantaneously by the capacitor 19.

When the device is being turned off:

the detected physical quantity becomes the set value or larger, and when the comparator in FIGS. 1 to 5 is operated, the switch circuit 21 is turned on, so that the potential of VPg in FIG. 10(b) is increased instantaneously by the capacitor 22.

In this case, the switching characteristic of the IGBT, for example, di/dt, becomes lower than that when the switch circuit 18 (21) is on-state.

Next, the controlling method is described.

Figure 11:
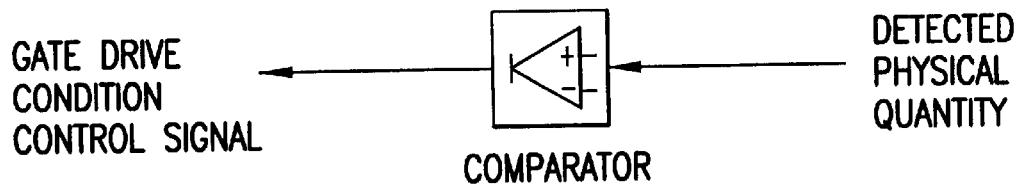
FIG. 11 is a circuit diagram showing an example of an instantaneous value control circuit.

(a) FIG. 11 shows an example in which an instantaneous value control is implemented. In this circuit, the gate drive condition control signal is operated in accordance with the operation of the comparator (FIGS. 1 to 5 show this example). Thus, each time the detected physical quantity exceeds a certain threshold, the IGBT is driven by changing its gate drive condition. In this case, the IGBT follows the detected physical quantity, but vibration is likely to occur.

Figure 12:
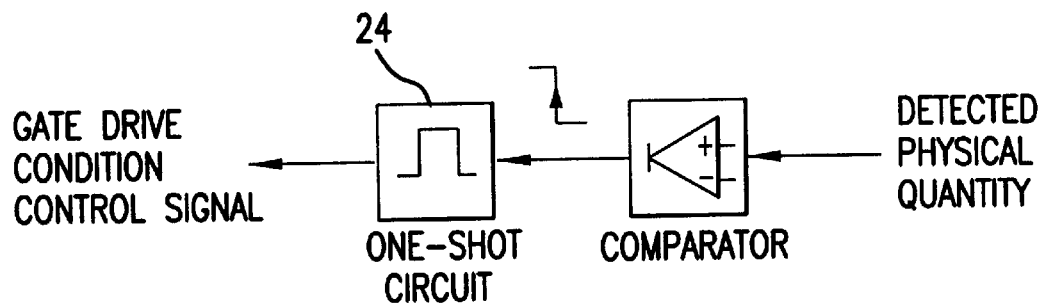
FIG. 12 is a circuit diagram showing a example of an one-shot control circuit.

(b) FIG. 12 shows an example in which the IGBT is operated for a specified time (one-shot circuit).

Reference numeral 24 in this figure denotes a monostable multi-vibrator circuit that outputs a one-shot pulse for a set constant time starting at the rising or falling edge of the comparator. Thus, as the gate drive condition is changed, the IGBT is driven for a specified time starting at the moment the detected physical quantity exceeds a certain threshold. In this case, its followup is inferior to the above case, but it is stable.

Although, in the above embodiment, the gate drive conditions are controlled in two ways, that is, in a digitalized manner based on the output from the operation means, analog control is also possible.

Figure 13:
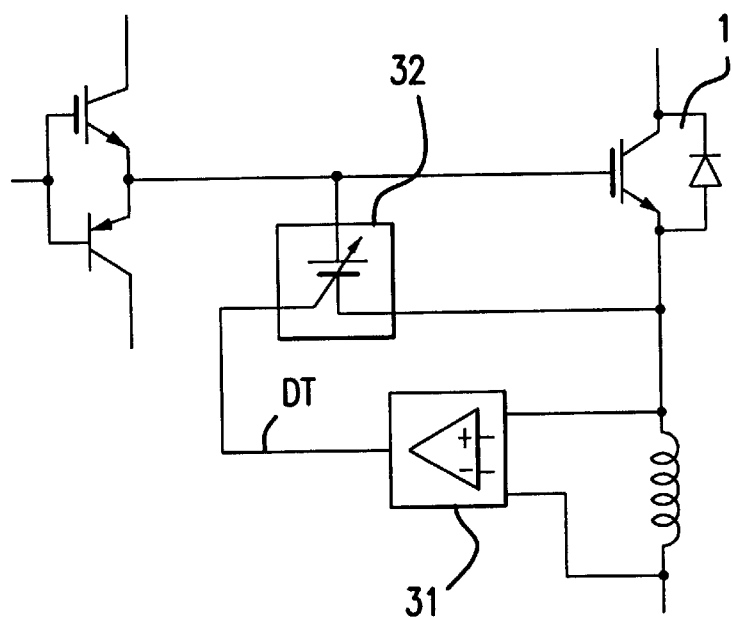
FIG. 13 is a block diagram showing another embodiment of the invention.

FIG. 13 shows an example of such a case. In this example, a detection circuit 31 and an adjustment circuit 32 are provided for the main IGBT and FWD 1.

Figure 14A:
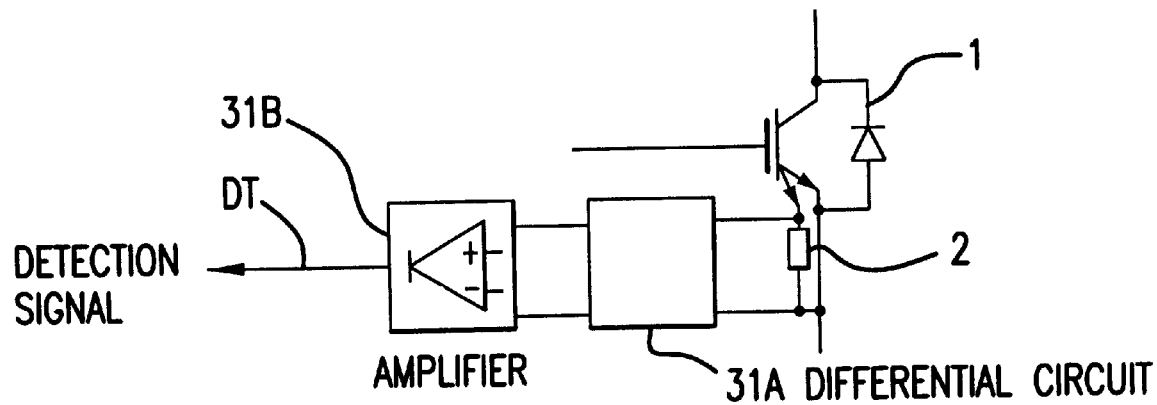
FIGS. 14(a) and 14(b) are block diagrams showing specific examples of the detection circuit used in FIG. 13.
Figure 14B:
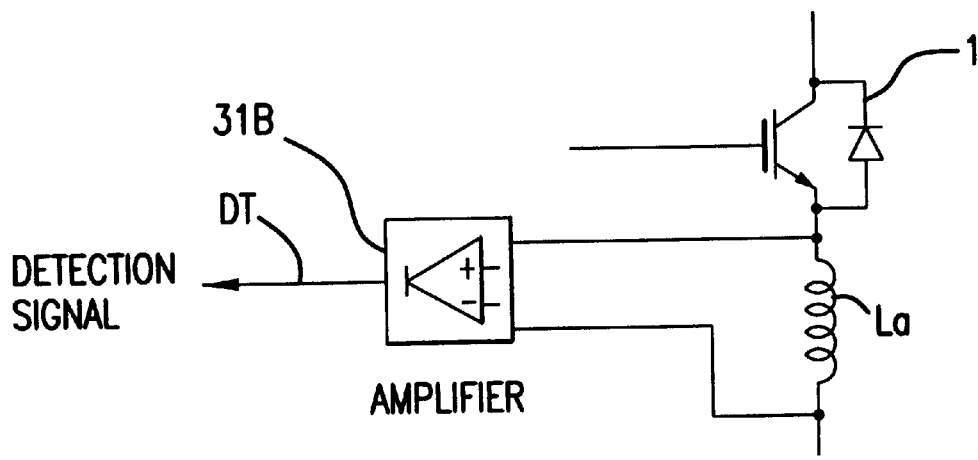

First, FIGS. 14(a) and 14(b) show an example of a detection circuit.

In FIG. 14(a), 31A is a differential circuit and 31B is an amplifier. By inputting a voltage at both ends of a resistor 2 used to sense the current of the IGBT, which is integrated into the IGBT module, i.e. a voltage equivalent of the value of the current of the IGBT, to the differential circuit 31A, a time differential equivalent of the collector current of the IGBT is obtained from the output of the differential circuit 31A. The amplifier 31B carries out a level matching with a gate drive section, and its output signal is used as the detection signal DT.

In FIG. 14(b), the time differential equivalent of the collector current is directly obtained from the voltage at both ends of the inductance La (intentionally connected inductor or the inductance of the wiring) connected in series with the IGBT 1.

The detection signal DT obtained as shown in FIGS. 14(a) and 14(b) is inputted to the adjustment circuit 32, which incorporates a circuit for adjusting the voltage applied between the gate and emitter of IGBT 1 depending on the magnitude of the detection signal DT.

Figure 15:
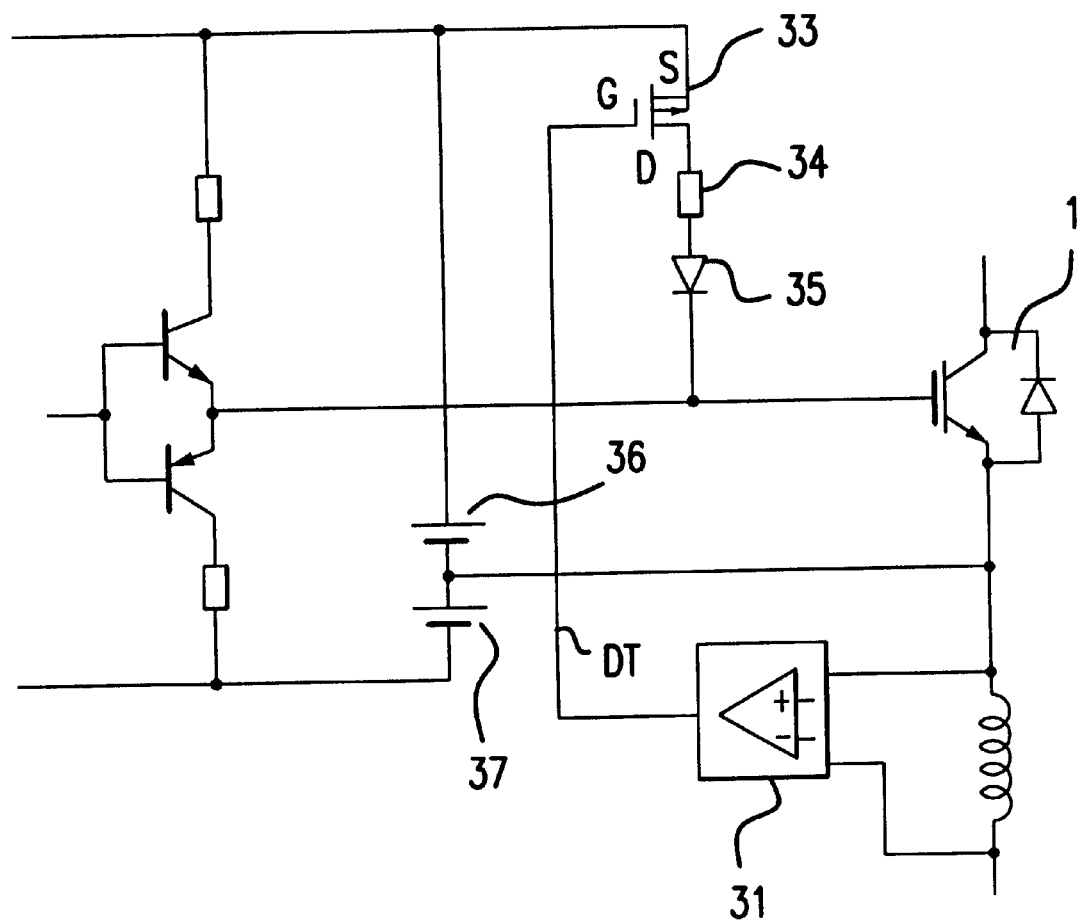
FIG. 15 is a block diagram showing a specific example of an adjustment circuit used in FIG. 13.
Figure 16:
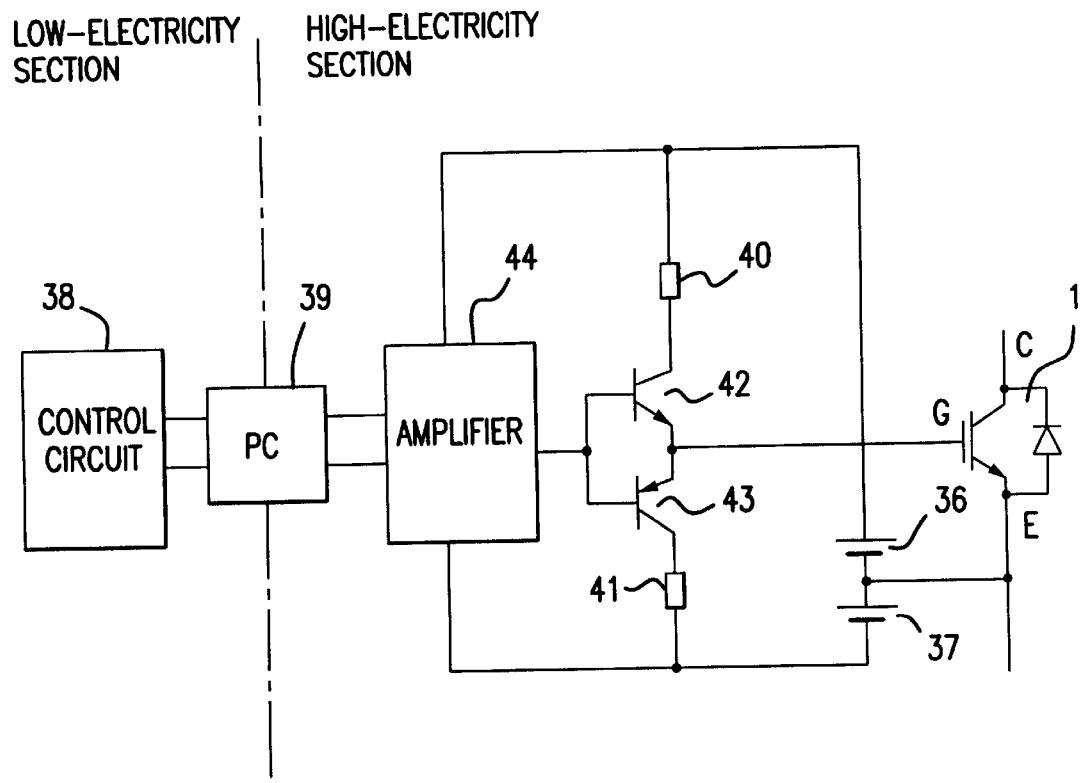
FIG. 16 is a block diagram showing a conventional gate drive circuit.
Figure 17:
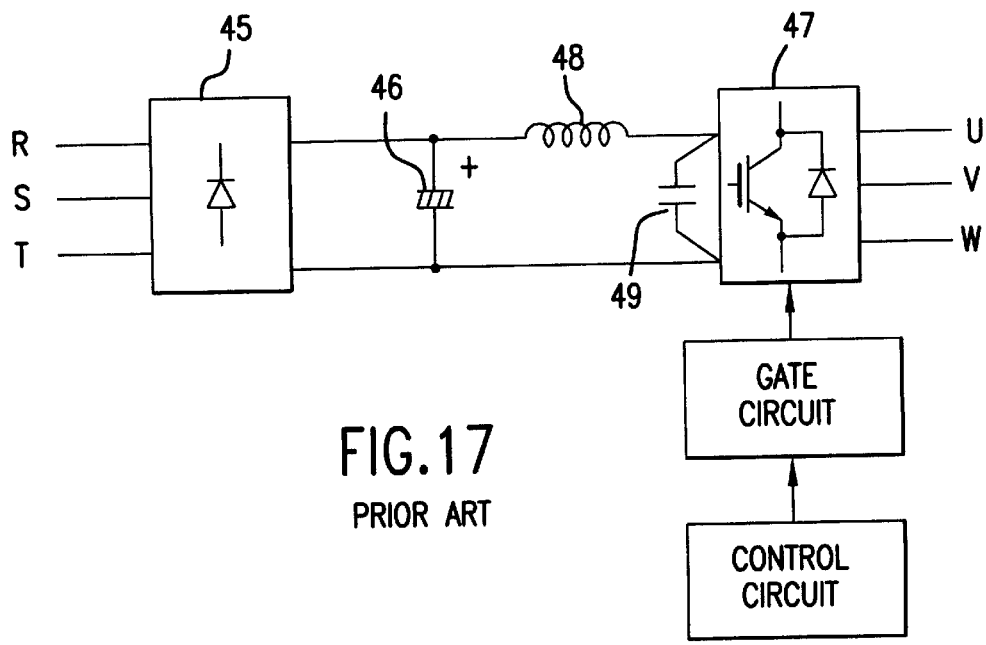
FIG. 17 is a block diagram showing a conventional inverter apparatus.
Figure 18:
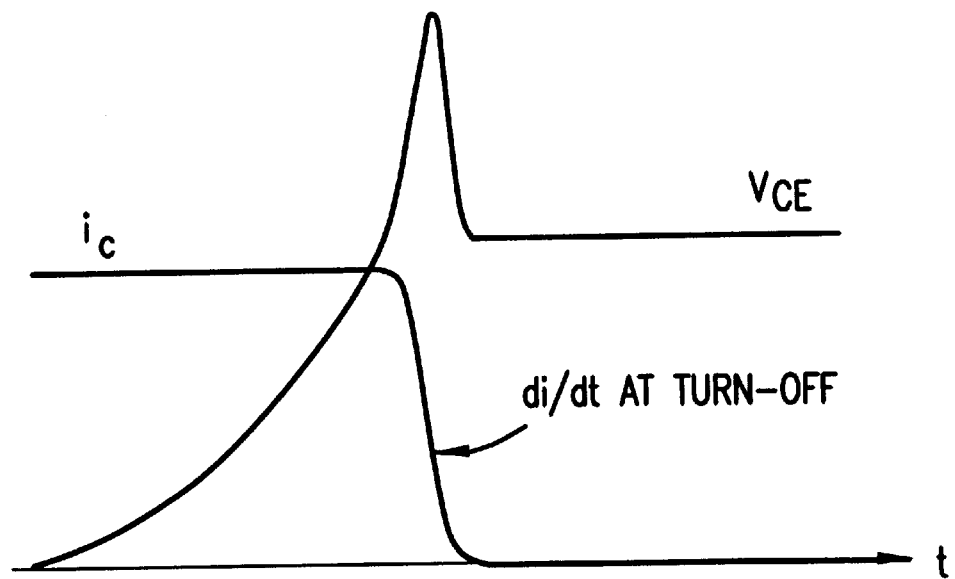
FIG. 18 describes an operation of an IGBT element while the device is being turned off.
Figure 19:
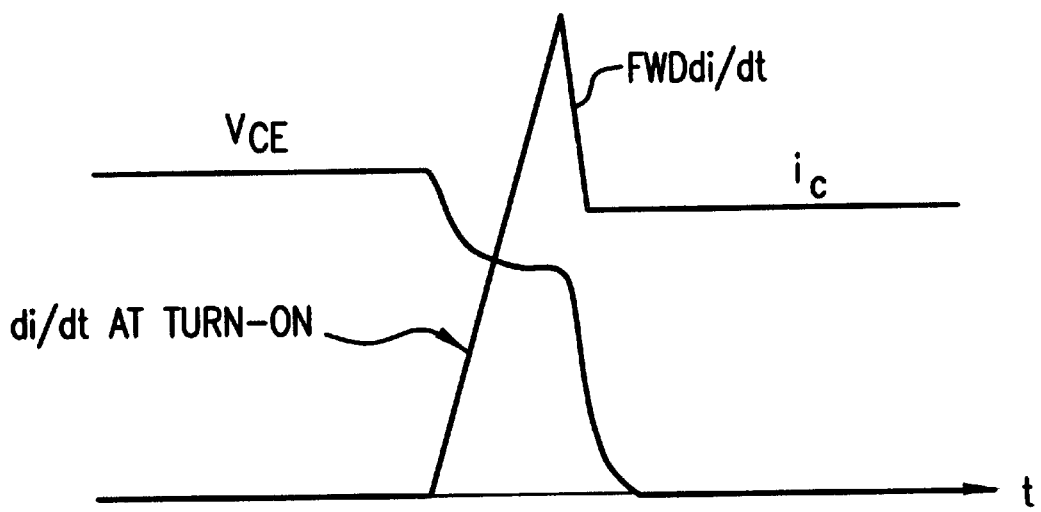

FIG. 15 shows a specific example of the adjustment circuit.

A series circuit comprising an FET 33, a resistor 34, and a diode 35 is connected between the positive electrode of a positive power supply of a gate drive section and the gate terminal of the IGBT 1. Thus, the FET 33 acts as a variable resistance to adjust the voltage applied between the gate and emitter of the IGBT 1 depending on the magnitude of the detection signal DT. A resistor 34 is not always required.

According to this invention, when the IGBT is turned on, dv/dt and the spike voltage applied to the FWD are reduced, whereas when it is turned off, the spike voltage applied to the IGBT is reduced. Consequently, when an apparatus, such as an inverter, is formed, a device with a rating lower than that of the prior art can be used to eliminate the need for a snubber circuit, thereby reducing the size, cost, and noise of the apparatus.

In particular, according to an eighth aspect, the appropriate selection of FETs and resistance value enables the collector current change rate di/dt to be reduced to an arbitrary value when the device is being turned off.

What is claimed is:

1. A gate drive circuit in a power converter, comprising:
   a voltage-driven switching device, and
   a gate drive circuit connected to the voltage-driven switching device for driving the same, said gate drive circuit including detection means for detecting at least one physical value selected from the group consisting of a collector current time differential equivalent, a collector current equivalent, and a collector-emitter voltage time differential equivalent in said switching device, and operation means for changing a gate drive condition of said switching device, said operation means changing at least one value selected from the group consisting of a gate resistance, a gate power supply voltage, a gate current, a gate-emitter capacitance and a gate-collector capacitance for the switching device so that only when an output of said detection means becomes a value outside a specified range at a turn-on operation of the switching device, said operation means changes the gate drive condition to reduce an excessive load applied to the switching device at the turn-on operation.

2. A gate drive circuit in a power converter according to claim 1, wherein said operation means changes the gate drive condition instantaneously only when the output of the detection means becomes a value outside the specified range.

3. A gate drive circuit in a power converter according to claim 1, wherein said operation means changes the gate drive condition for a predetermined interval only when the output of the detection means becomes a value outside the specified range.

4. A gate drive circuit in a power converter, comprising:
   a voltage-driven switching device, and
   a gate drive circuit connected to the voltage-driven switching device for driving the same, said gate drive circuit including detection means for detecting at least one physical value selected from the group consisting of a collector current time differential equivalent, a collector-emitter voltage time differential equivalent and a collector-emitter voltage equivalent of the switching device in said switching device, and operation means for changing a gate drive condition of said switching device, said operation means changing at least one value selected from the group consisting of a gate resistance, a gate power supply voltage, a gate current, a gate-emitter capacitance and a gate-collector capacitance for the switching device so that only when an output of said detection means becomes a value outside a specified range at a turn-off operation of the switching device, said operation means changes the gate drive condition to reduce an excessive load applied to the switching device at the turn-off operation.

5. A gate drive circuit in a power converter according to claim 4, wherein said operation means changes the gate drive condition instantaneously only when the output of the detection means becomes a value outside the specified range.

6. A gate drive circuit in a power converter according to claim 4, wherein said operation means changes the gate drive condition for a predetermined interval only when the output of the detection means becomes a value outside the specified range.

7. A gate drive circuit in a power converter, comprising:
   a voltage-driven switching device having a gate and an emitter, and
   a gate drive circuit connected to the voltage-driven switching device for driving the same, said gate drive circuit including detection means for detecting a collector current time differential equivalent of said switching device at a time of turn-off of the switching device, and adjustment means for adjusting a voltage applied between the gate and emitter of the switching device, said adjustment means adjusting the voltage only when a value detected by the detection means is outside a specified range to thereby reduce an excessive load applied to the switching device at the time of turn-off of the switching device.

8. A gate drive circuit in a power converter according to claim 7, wherein said adjustment means comprises a field-effect transistor connected between a positive electrode of a positive power supply of the gate drive circuit and the gate of the switching device.

9. A gate drive circuit in a power converter according to claim 1, wherein when the output of the detection means becomes a value outside the specified range, the operation means increases the gate resistance for the switching device.

10. A gate drive circuit in a power converter according to claim 4, wherein when the output of the detection means becomes a value outside the specified range, the operation means increases the gate resistance for the switching device.

11. A gate drive circuit in a power converter according to claim 1, wherein when the output of the detection means becomes a value outside the specified range, the operation means decreases the gate power supply voltage for the switching device.

12. A gate drive circuit in a power converter according to claim 4, wherein when the output of the detection means becomes a value outside the specified range, the operation means decreases the gate power supply voltage for the switching device.

13. A gate drive circuit in a power converter according to claim 1, wherein when the output of the detection means becomes a value outside the specified range, the operation means decreases the gate current for the switching device.

14. A gate drive circuit in a power converter according to claim 4, wherein when the output of the detection means becomes a value outside the specified range, the operation means decreases the gate current for the switching device.

15. A gate drive circuit in a power converter according to claim 1, wherein when the output of the detection means becomes a value outside the specified range, the operation means increases the gate-emitter capacitance for the switching device.

16. A gate drive circuit in a power converter according to claim 4, wherein when the output of the detection means becomes a value outside the specified range, the operation means increases the gate-emitter capacitance for the switching device.

17. A gate drive circuit in a power converter according to claim 1, wherein when the output of the detection means becomes a value outside the specified range, the operation means increases the gate-collector capacitance for the switching device.

18. A gate drive circuit in a power converter according to claim 4, wherein when the output of the detection means becomes a value outside the specified range, the operation means increases the gate-collector capacitance for the switching device.

* * * * *